(12) United States Patent
Chava et al.

(10) Patent No.: US 12,046,303 B2
(45) Date of Patent: Jul. 23, 2024

(54) SMART PROLOGUE FOR NONVOLATILE MEMORY PROGRAM OPERATION

(71) Applicant: Intel NDTM US LLC, Santa Clara, CA (US)

(72) Inventors: Pranav Chava, Folsom, CA (US); Aliasgar S. Madraswala, Folsom, CA (US); Sagar Upadhyay, Folsom, CA (US); Bhaskar Venkataramaiah, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 897 days.

(21) Appl. No.: 16/895,890

(22) Filed: Jun. 8, 2020

(65) Prior Publication Data
US 2021/0383880 A1 Dec. 9, 2021

(51) Int. Cl.
| | | |
|---|---|---|
| G11C 16/12 | (2006.01) | |
| G11C 7/22 | (2006.01) | |
| G11C 16/08 | (2006.01) | |
| G11C 16/10 | (2006.01) | |
| G11C 16/26 | (2006.01) | |
| G11C 16/30 | (2006.01) | |
| G11C 16/34 | (2006.01) | |

(52) U.S. Cl.
CPC .......... *G11C 16/3459* (2013.01); *G11C 7/222* (2013.01); *G11C 16/08* (2013.01); *G11C 16/10* (2013.01); *G11C 16/26* (2013.01); *G11C 16/30* (2013.01)

(58) Field of Classification Search
CPC ..................................................... G11C 16/12
See application file for complete search history.

(56) References Cited

U.S. PATENT DOCUMENTS

| | | | |
|---|---|---|---|
| 10,224,107 B1 * | 3/2019 | Sule | G11C 16/12 |
| 2006/0285392 A1 | 12/2006 | Incarnati et al. | |
| 2007/0109845 A1 | 5/2007 | Chen | |
| 2011/0051521 A1 | 3/2011 | Levy et al. | |
| 2011/0075480 A1 | 3/2011 | Cernea | |
| 2011/0138111 A1 | 6/2011 | Kim et al. | |
| 2011/0261625 A1 | 10/2011 | Nguyen et al. | |
| 2014/0104955 A1 | 4/2014 | Kwak et al. | |
| 2014/0347928 A1 | 11/2014 | Lee | |

(Continued)

OTHER PUBLICATIONS

European First Office Action, (EP Exam Report Article 94(3) EPC), for Patent Application No. 20209470.2, Mailed Feb. 8, 2023, 5 pages.

(Continued)

*Primary Examiner* — Jason Lappas
(74) *Attorney, Agent, or Firm* — Compass IP Law PC

(57) ABSTRACT

For a nonvolatile (NV) storage media such as NAND (not AND) media that is written by a program and program verify operation, the system can apply a smart prologue operation. A smart prologue operation can selectively apply a standard program prologue, to compute program parameters for a target subblock. The smart prologue operation can selectively apply an accelerated program prologue, applying a previously-computed program parameter for a subsequent subblock of a same block of the NV storage media. Application of a prior program parameter can reduce the need to compute program parameters for the other subblocks.

14 Claims, 10 Drawing Sheets

(56) References Cited

U.S. PATENT DOCUMENTS

| | | |
|---|---|---|
| 2016/0019949 A1 | 1/2016 | Raghunathan et al. |
| 2020/0066350 A1 | 2/2020 | Moschiano et al. |
| 2020/0111529 A1 | 4/2020 | Shin |
| 2020/0194070 A1 | 6/2020 | Lee |

OTHER PUBLICATIONS

Extended European Search Report for Patent Application No. 20209470.2, Mailed May 17, 2021, 7 pages.

* cited by examiner

SMART PROLOGUE FOR NONVOLATILE MEMORY PROGRAM OPERATION

FIELD

Descriptions are generally related to nonvolatile storage, and more particular descriptions are related to a variable prologue sequence for nonvolatile memory program operation.

BACKGROUND

Programming or writing a nonvolatile media block, such as a NAND (not AND) media, can include three sections: a prologue, a program and verify sequence, and an epilogue. Traditionally, the media controller computes one or more program parameters to apply to program the nonvolatile media block during the prologue. Without the computation of the program parameters, the programming of the nonvolatile media would not have proper performance.

The speed of the program operation can be the performance perceived by a user of a computing system. Thus, a shorter program operation can improve the system performance. With improvements in the program and verify sequence, the time spent performing program and verify reduces. As the time spent on program and verify decreases, the time performing computations in the prologue operation becomes a more significant portion of the overall program time.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
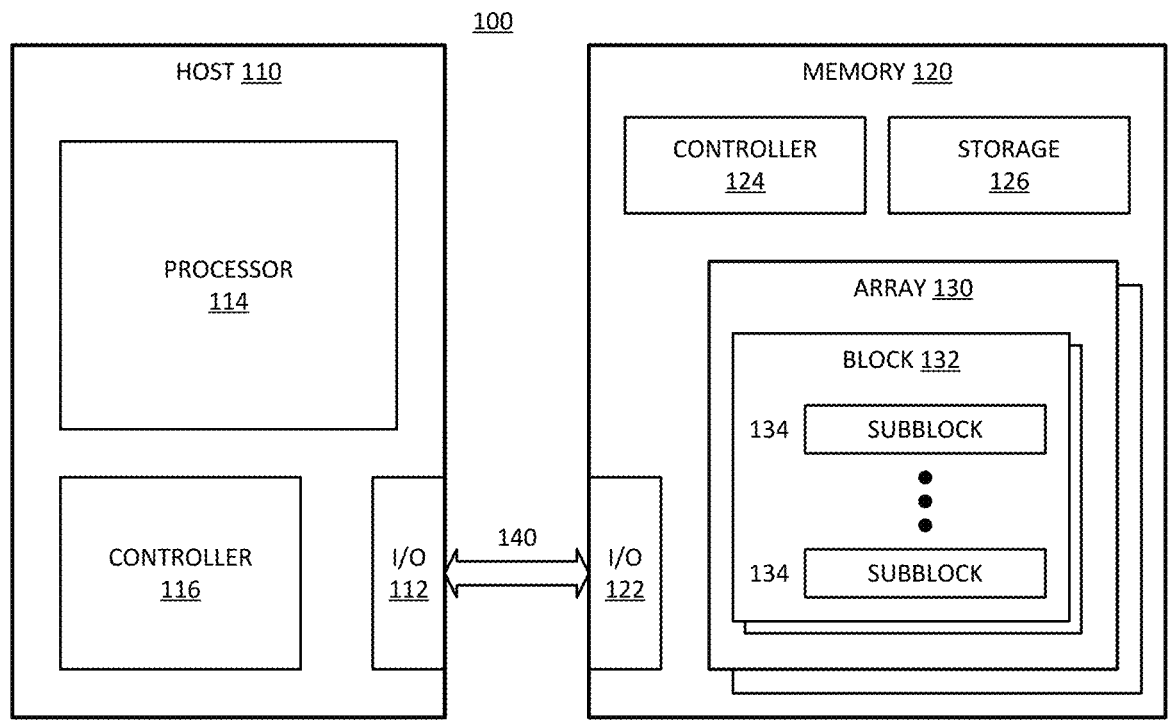
FIG. 1 is a block diagram of an example of a system in which a nonvolatile memory can apply a selectively shortened prologue.

Descriptions of certain details and implementations follow, including non-limiting descriptions of the figures, which may depict some or all examples, and well as other potential implementations.

DETAILED DESCRIPTION

As described herein, a nonvolatile (NV) storage media written by a program and program verify operation can be programmed in accordance with a smart prologue operation. A smart prologue operation selectively applies a standard program prologue, with computation of program parameters for a target subblock, or an accelerated program prologue, with application of a stored, computed program parameter to subblocks. The smart prologue operation can selectively apply an accelerated program prologue, applying a previously-computed program parameter for a same subblock of a block of the NV storage media. Application of a prior program parameter can reduce re-computation of program parameters for the other subblocks, where computation of a previous program parameter can be applied with proper program performance.

In one example, the NV storage media is a NAND (not AND) media. In one example, the NV storage media is a cache media for a primary storage media. For example, the NV storage media can be an SLC (single level cell) media to act as a cache device for an MLC (multilevel cell) media. The SLC media stores a binary bit in each storage cell (e.g., a one or zero). An MLC media can be a TLC (triple level cell), a QLC (quad level cell), or other multilevel cell. An MLC media storage cell stores one of multiple levels to represent more than two states.

Many storage devices, such as a solid state drives (SSDs), have an MLC primary storage media and an SLC cache storage media. SLC blocks as a caching solution improve the performance of storage devices during both sequential and sustained write operations. Sequential write operations are write operations that write to storage locations sequentially, and can refer to back to back write operations. Sustained write operations can refer to sequential write operations that continue for a period of time that is generally long enough to max out the write cache. SLC block caching can provide improved sequential write operation performance by writing to the faster (SLC) block of storage, rather than the slower (MLC) block of storage. SLC caching can improve sustained write operation performance by writing directly to the SLC cache while the SLC cache data is transferred to the MLC media.

The descriptions throughout make reference to a NAND media. It will be understood that the application of the smart prologue can be applied to the write or program operation of any media that needs to compute program or write parameters for separate blocks of data. A block of data for purposes of computation of program parameters can refer to a group of write units, where different groups of write units have differences in the ideal program parameters to ensure the highest program performance. A write unit refer to an atomic unit for a write operation or the smallest amount of data that will be written in a write operation.

The program or write operation includes at least a section where the media controller computes the parameters to maximize write performance for the target block of media or group of atomic units, and a section where the media controller writes the data to the media. For example, a NAND media can be separated as blocks of media that each include multiple subblocks. The subblock can be an atomic write unit for a program operation, and the block is the group of subblocks.

The computation of the parameters can be a program operation section referred to as a prologue. The prologue can also include a warmup or conditioning of charge pumps used to boost voltage for a media that is written with voltages higher than a supply voltage. The writing of data can occur in a section referred to as a program and verify sequence. The writing of the data can be referred to as a program verify sequence or a pulse-verify loop, where the "pulse" refers to the program pulse applied to commit data to the media. The "verify" can refer to a lower voltage pulse to verify the data was written correctly. The "loop" of the writing of the data can refer to repetition of program and verify operations until the data is confirmed to have been committed to the media, or until a maximum number of loops has been reached. In one example, the write operation also includes an epilogue. The epilogue can discharge excess charge from the program circuitry, including turning off charge pumps.

The prologue can be referred to as a "Smart Prologue" when it can selectively allow for faster write performance of the NV media by reducing the logic overhead of a program operation. The logic overhead can be reduced, for example, by skipping redundant calculations if the program is continued for segments of the NV media that have similar physical characteristics, and thus, can be effectively programmed with the same program parameters. For example, the media controller could compute the program parameters for a first of multiple subblocks, and then apply the same program parameters for other subblocks of the same block. In one example, the subblocks will apply the same parameters only if they are in the same block as well as on same WL (wordline). Application of a smart prologue has been estimated to reduce the prologue latency in certain NAND implementation to result in the reduction of a tPROG for continuous as well as bursty SLC program operations by up to %30.

In one example, a smart prologue capability enables the system to store parameters such as start voltage, step size for program loop, max number of loops, or other parameters. The parameters can be specific to program a first of multiple subblocks in a block or in a wordline. During program of subsequent subblocks in the same block, the media controller can perform the programming based on stored values from the computations for the first subblock. Thus, the media controller can directly load and use the parameters for subsequent subblocks instead of recalculating the parameters for each subblock. In one example, such an operation can improve prologue latency by up to approximately 75% (i.e., the accelerated prologue time is only ¼ of the standard prologue where the media controller computes all parameters).

FIG. 1 is a block diagram of an example of a system in which a nonvolatile memory can apply a selectively shortened prologue. System 100 includes host 110, which represents a control platform for a computing device or computing system. Host 110 can provide a hardware control platform through a host processor and interconnect hardware to connect the host processor to peripherals or other components. Host 110 can provide a software control platform through a host operating system (OS) executing on the host processor, as well as software and firmware modules that provide control for the interconnecting hardware.

In one example, host 110 includes processor 114 as a host processor. Processor 114 represents a processor or processing unit device that generates requests for data on memory 120. In one example, processor 114 represents a central processing unit (CPU), a graphics processing unit (GPU), or other processor that requests access to data in memory 120. In one example, processor 114 is a multicore processing device.

Host 110 includes controller 116, which represents a host controller to control access to memory 120. The access can include read commands to read data from memory 120, and write commands to commit data to memory 120. In one example, controller 116 is part of processor 114. In one example, controller 116 is coupled to processor 114 over a system on a chip (SOC) substrate. In one example, controller 116 is a memory controller that accesses memory 120 over a high speed system memory bus. In one example, controller 116 is a storage controller that accesses memory 120 over a peripheral bus.

Host 110 includes I/O (input/output) 112. I/O 112 represents hardware interface components to interconnect with memory 120. I/O 112 can include drivers, receivers, termination, and other hardware. In one example, I/O 112 can be considered to include logic or software/firmware to configure and operate the interconnection hardware.

Bus 140 represents one or more buses to interconnect host 110 to memory 120. In one example, bus 140 includes a point to point bus. In one example, bus 140 includes a multidrop bus. Bus 140 can include signal lines to carry a command to memory 120 from controller 116. Bus 140 includes signal lines to carry data between host 110 and memory 120. Memory 120 includes I/O 122, which can be comparable to I/O 112 of host 110.

Memory 120 includes controller 124, which represents a media controller to control access to the media of array 130. It will be understood that controller 124 on memory 120 is separate from controller 116 of host 110. Controller 116 is a host-side controller that controls access from components of host 110 to memory 120. Controller 124 on memory 120 decodes incoming commands from controller 116 and generates internal operations to execute the commands.

Array 130 represents an array of bitcells or storage cells or memory cells. In one example, array 130 represents a nonvolatile (NV) storage media to store data. Array 130 can be written by a program and program verify operation. A nonvolatile media retains state even when power is interrupted to the memory. In contrast, a volatile media becomes indeterminate if power is interrupted to the memory. Array 130 can represent separate memory chips or separate planes of media. In one example, memory 120 includes multiple arrays 130. A multiplane memory refers to a memory with multiple independently accessible storage arrays. Thus, the array can be accessed in parallel. In one example, memory 120 has a single plane. In one example, memory 120 has multiple planes, such as two planes or four planes.

Each array 130 has rows and columns of storage media. In one example, the storage media is a three-dimensional (3D) storage array with the rows and columns also separated into stacks with vertical columns. The vertical architecture can be varied, and a wordline can extend horizontally and vertically.

Each array 130 has multiple blocks 132. A block is a segment of array 130 that is separately addressable by controller 124 or the media controller. In one example, each block 132 includes multiple subblocks 134. The number of blocks in array or arrays 130 can be a binary number, such as 64 blocks, 128 blocks, 256 blocks, 512 blocks, or some other number. The number is not necessarily binary. The number of subblocks in the blocks can be, for example, 8, 16, 24, or some other number.

In one example, memory 120 includes storage 126. When controller 124 computes the program parameters to write data or commit data to a block 132 of memory, controller 124 can compute the parameters for a first subblock 134 and store one or more parameters in storage 126. For programming of the other subblocks 134, controller 124 can access the parameter(s) from storage 126 instead of needing to compute the parameters for each subblock 134.

In one example, storage 126 is part of controller 124. In one example, storage 126 is a register device. In one example, storage 126 is an SRAM (synchronous random access memory) device. In one example, controller 124 executes firmware or software to perform the program operations, including storing computed parameters in storage 126 and applying the stored parameters to other subblocks.

In one example, memory 120 includes at least two different arrays 130 with at least two different media types. For example, memory 120 can include one or more arrays 130 of SLC NAND as a cache for a TLC NAND primary storage. As another example, memory 120 can include one or more arrays 130 of SLC NAND as a cache for a QLC NAND primary storage. In one example, there will be a number of SLC arrays to match the primary storage. For example, memory 120 can include a TLC primary array and three or some multiple of three of SLC arrays. As another example, memory 120 can include a QLC primary array and four or some multiple of four of SLC arrays.

It will be understood that in general the physics associated with the different subblocks of a block will be similar. The physics of subblocks of different blocks can have enough difference that a program parameter for subblocks between blocks will not have good write performance. However, a program parameter for subblocks within a block should have similar write performance. In one example, controller 124 re-uses computed program parameters between subblocks expected to have similar physical characteristics, such as subblocks within the same block, or subblocks within the same block within the same wordline.

Figure 2:
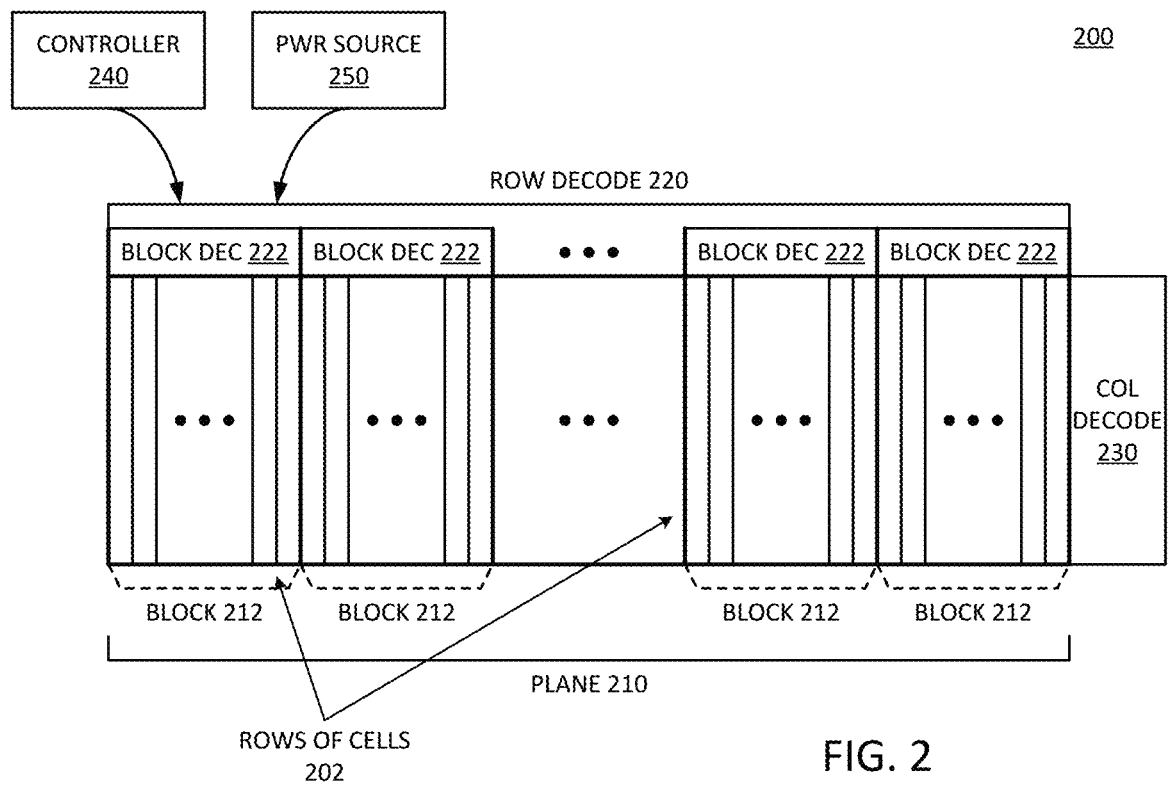
FIG. 2 is a block diagram of an example of a memory architecture subdivided into array blocks that can apply stored program parameters.

FIG. 2 is a block diagram of an example of a memory architecture subdivided into array blocks that can apply stored program parameters. Memory 200 illustrates components of a memory device with a specific mapping of I/O (input/output) to portions of the memory array, which can be a memory array in accordance with system 100. In one example, memory 200 represents memory elements that are part of a solid state drive (SSD) that stores data in nonvolatile bitcells. Memory 200 selectively connects the I/O to specific cells with decoder circuitry, which enables access to specific cells.

Memory 200 includes one or more planes 210, which includes multiple rows of cells 202. The vertical rectangles of the diagram represent the rows. In one example, plane 210 is organized as multiple blocks 212. It will be understood that the expression "plane" is used as an example, and other terminology could be used for a memory device or storage device to refer to the array of cells used to store data. Block 212 can refer to a group of rows 202.

An access command (either a read command or a write/program command) triggers command signal lines that are interpreted by row decode logic 220 to select a row or rows for the operation. In one example, row decode logic 220 includes block decode logic 222 to select a specific block 212 of bank 210. Block decode (DEC) 222 can represent another level of decoding logic, which can be in addition to row decode 220 or can simply be a specific type of row decode 220. Block decode 222 can provide specific access to subblocks of memory within the block (not specifically represented in the drawing).

Memory 200 includes column decode logic 230 to select a column of data, where signal lines from specific blocks or subblocks can be connected to sense amplifiers to allow the routing of data between the storage cells and I/O (not specifically shown). The I/O can include local I/O and global I/O. Local I/O can refer to the routing circuitry to transfer data of specific blocks 212. Global I/O can refer to the routing circuitry that couples the local I/O to the external I/O connectors of memory 200.

In one example, decoders of row decode 220 or block decode 222 or both apply program parameters to write data to selected cells. In one example, block decode 222 is or includes a block driver as part of the decoder circuitry. The block driver can be an access device controlled to program selected cells. In one example, controller 240 provides control signals to cause specific decode logic to apply program signals to specific blocks and subblocks of memory 200 to perform a program operation.

Power (PWR) source 250 represents a power source that provides power to program the cells of memory 200. In one example, power source 250 includes circuitry that is enabled in a prologue phase of a program operation, and disabled in an epilogue of the program operation. In one example, controller 240 computes specific voltage levels to apply from power source 250 to perform the program operation on a selected subblock of memory 200. For subsequent subblocks in the same block, controller 240 can apply the same program parameters without having to recompute the program parameters, in accordance with any example herein.

Figure 3:
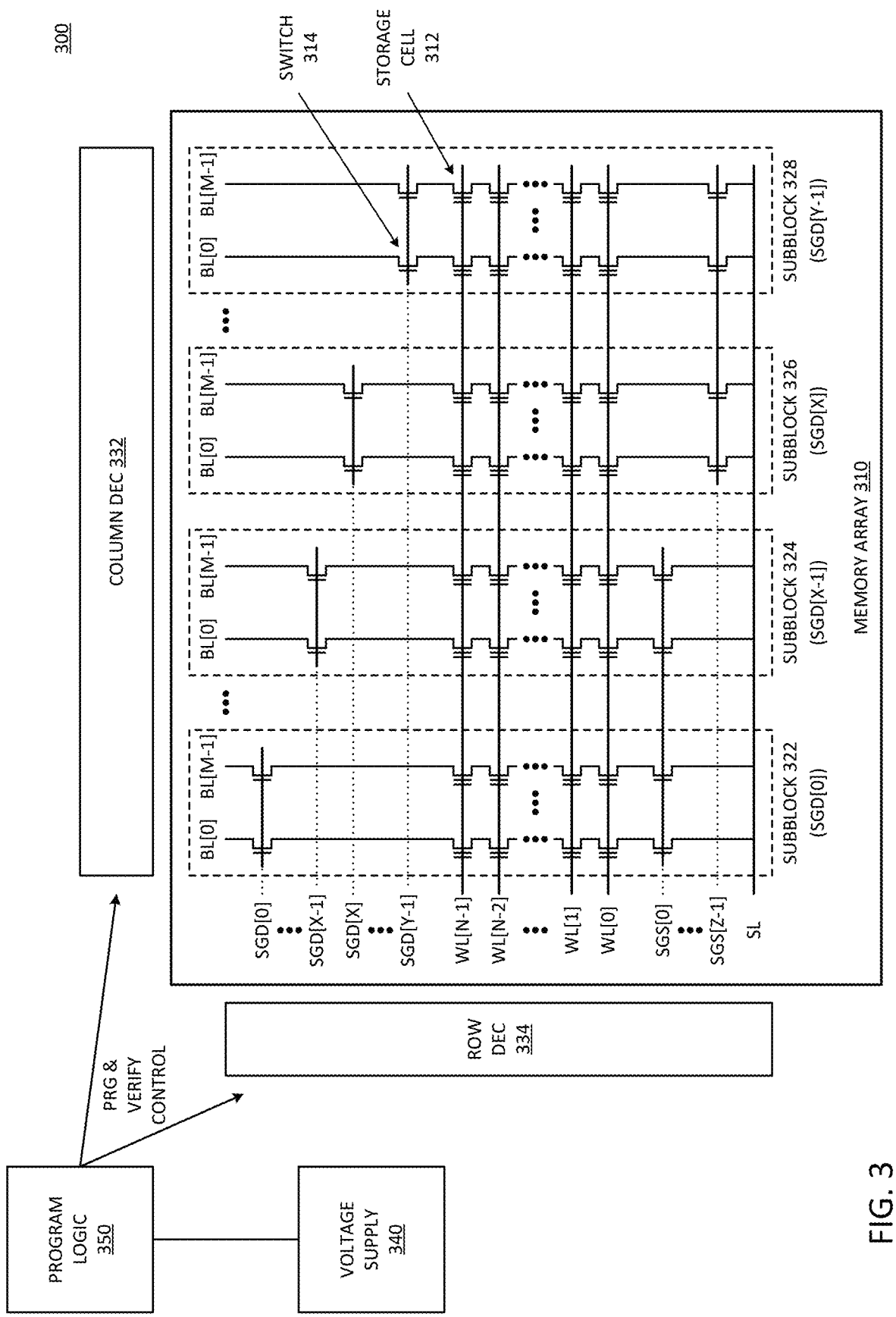
FIG. 3 is a block diagram of an example of a system having a memory device with a subblock architecture, where a program parameter can be applied to different subblocks after being computed for a first subblock.

FIG. 3 is a block diagram of an example of a system having a memory device with a subblock architecture, where a program parameter can be applied to different subblocks after being computed for a first subblock. System 300 represents a storage device in which a program operation can include a smart prologue feature, such as memory 120 of system 100. In one example, system is or is included in a solid state drive (SSD). System 300 can be integrated into a computing device.

System 300 includes memory array 310. In one example, memory array 310 represents a 3D NAND storage device. In one example, memory array 310 represents a 3D stacked memory device. Storage cells 312 represent NV storage cells. In one example, the storage cells 312 represent NAND storage cells. In one example, memory array 310 is an SLC array.

Memory array 310 includes N wordlines (WL[0] to WL[N−1]). N can be, for example, 32, 48, 64, or some other number. In one example, memory array 310 is segmented into subblocks. Subblocks 322, 324, 326, and 328 are illustrated, but are only to be understood as illustrative and not limiting. Segmentation of the memory array into different subblocks can include segmenting into any number of subblocks.

In one example, a subblock refers to the columns, pillars, or strings of storage cells 312 that are accessed together. The pillars or vertical channels can be accessed to together by responding to a common switching signal. The switching signal can refer to gating control for the pillar. For example, the various pillars can be controlled by select gate drain (SGD) signal lines and select gate source (SGS) signal lines. Switches 314 represent the switching elements that can selectively apply the SGD and SGS signaling. An SGD signal line selectively couples a column to a bitline (BL). An SGS signal line selectively couples a column to a source line (SL). The source line (SL) can be a source layer of material integrated onto a semiconductor substrate.

In one example, each subblock includes M bitlines (BL[0] to BL[M−1]). In one example, each storage cell 312 within memory array 310 is addressed or selected by asserting a wordline and a bitline, in conjunction with enabling the column with the gate select switches 314 (shown only on SGD, but SGS switches can be considered included in the control).

As specifically illustrated, memory array 310 includes SGD[0] to control selection of columns in subblock 322, SGD[X−1] to control selection of columns in subblock 324, SGD[X] to control selection of columns in subblock 326, and SGD[Y−1] to control selection of columns in subblock 328. In one example, multiple subblocks share a common source selection. Thus, for the Y SGD signal line illustrated, there are only Z SGS signal lines (SGS[0] to SGS[Z−1]), where Z is understood to be less than Y. In one example, memory array 310 includes the same number of SGS signal lines as SGD signal lines. As illustrated, SGD is segmented to provide separate control for the different subblocks, with one SGD segment per subblock. Likewise, SGS is segmented, with one SGS segment providing control for multiple subblocks.

System 300 includes column decode circuitry (column DEC) 232 as a column address decoder to determine from a received command which bitline or bitlines to assert for a particular command. Row decode circuitry (row DEC) 334 represents a row address decoder to determine from a received command which wordline or wordlines to assert for the command.

System 300 operates based on power received from voltage supply 340. Voltage supply 340 represents one or more voltage sources or voltage levels generated within system 300 to power electronic components of an electronic device, which can include system 300. Voltage supply 340 can generate different voltage levels, either as multiple voltage levels from a single voltage supply, or different voltage levels from different voltage supplies. Voltage supply 340 can generate multiple program voltages and an inhibit voltage.

System 300 includes circuitry to apply different voltage levels to different layers of the column stack. In one example, column decode 332 and row decode 334 provide circuitry to apply the various voltages to the various columns and layers of the stack. System 300 can include other circuitry to apply the voltages to the different signal lines or layers of the stack. For example, system 300 can apply high or low voltage levels to the select lines (e.g., SGS, SGD) or to various WLs, or to a combination of wordlines and select lines. The application of the voltages to the select lines can determine whether the switches are open or closed, thus selectively deselecting (open switches) or selecting (closed switches) the columns. The application of voltage to the WLs can determine whether the individual storage cells 312 receive charge, provide charge, or are shut off from the charge.

In one example, system 300 includes program logic 350 coupled to voltage supply 340. Program logic 350 represents logic executed by a media controller or controller of the memory device to program storage cells 312. Program logic 350 provides program (PRG) and verify control with a smart prologue in accordance with any description herein. Program logic 350 can trigger the programming of multiple sequential subblocks of the same block of memory array 310, computing program parameters for the first subblock, and then applying the same program parameters for other subblocks. In one example, program logic 350 does not need to compute the program parameters again until programming a subblock that is in a different block or that has different physical characteristics that will need different program parameters for good write performance.

In one example, the nonvolatile memory is a block addressable memory device, such as NAND or NOR technologies. In one example, a nonvolatile memory device can include a future generation nonvolatile technology, such as a three dimensional crosspoint memory device, other byte addressable nonvolatile memory devices. A memory device can include a nonvolatile, byte addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Figure 4:
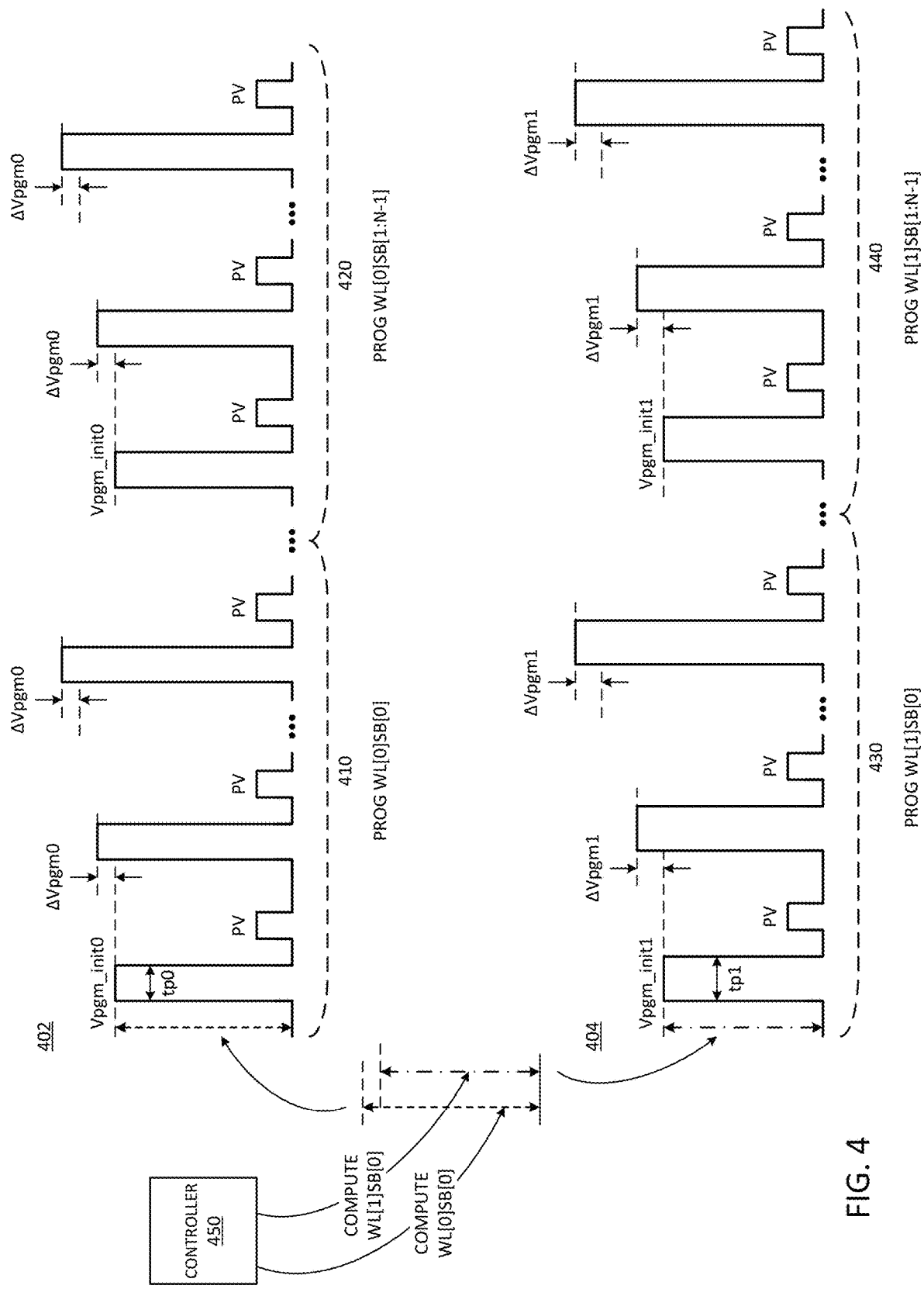
FIG. 4 is a diagram of an example of a pulse sequence for a program operation that applies a smart prologue.

FIG. 4 is a diagram of an example of a pulse sequence for a program operation that applies a smart prologue. Sequence 402 illustrates the general form of the program operation for multiple subblock of the same block. Sequence 402 and sequence 404 can be applied by a controller in accordance with controller 124 of system 100. The program sequence illustrates various program parameters for the program sequence of the NV media.

Regarding the program sequence, controller 450 computes the program parameters for a prologue. During the prologue computations, controller 450 computes the program parameters for the first wordline (WL[0]) and the first subblock (SB[0]). While the wordline is specifically mentioned, in one example, a block or other division of the memory array can be used in addition to, or in place of, the wordline. The dashed line represents the computed starting voltage, $Vpgm\_init0$, for the programming of WL[0]SB[0].

After computation of the parameters for the programming, the controller can initiate the program-verify sequence. Thus, after computing $Vpgm\_init0$, controller 450 can generate the first program pulse in sequence 402. In one example, other parameters that controller 450 can compute include the pulse width, $tp0$, and the program pulse step, $\Delta Vpgm0$. Sequence 402 illustrates that after the first pulse at the initial program voltage, controller 450 can generate a program verify pulse, labeled PV in sequence 402.

The program pulse typically increases in amplitude as the pulse number increases. Thus, the first pulse can have an amplitude of $Vpgm\_init0$ and each subsequent program pulse can have an increase of $\Delta Vpgm0$, which can be referred to as a program loop voltage step size. Phase 410 illustrates the program operation for WL[0]SB[0]. The number of program pulses can be one or more, depending on the configuration of the system. When the PV indicates the programming executed correctly, controller 450 does not need to increase by ΔVpgm0 and perform another program pulse. Rather, the controller can proceed to the next subblock to program. In one example, there is a maximum number of program pulses that will be used for the program, which can be a parameter computed by controller 450 in the prologue. Such a maximum can be referred to as a maximum number of program loops.

With the application of a smart prologue, in one example, controller 450 recognizes that the next program operations will be for the same wordline (WL[0]), for N−1 additional subblocks (SB[1:N−1]). Phase 420 represents the programming of the additional subblocks. In one example, controller 450 does not compute the program parameters again for WL[0]SB[1:N−1]. Rather, controller 450 uses a reduced prologue to load the program parameters computed for SB[0] to apply to each additional SB[1:N−1].

Sequence 404 illustrates the program operation for multiple subblocks of a different block than the block of sequence 402. Sequence 404 will be understood to directly follow sequence 402. It will be observed that sequence 404 is for programming SB[0:N−1], but for a different wordline, WL[1]. Thus, in one example, controller 450 computes the program parameters for a prologue for WL[1]. During the prologue computations, controller 450 computes the program parameters for the first subblock (SB[0]) of WL[1]. SB[0] can be the same subblock as SB[0] of sequence 402, but for a different wordline, SB[0] could have different program parameters for proper write performance. The dashed-dotted line represents the computed starting voltage, Vpgm_init1, for the programming of WL[1]SB[0].

After computation of the parameters for the programming, the controller can initiate the program-verify sequence. Thus, after computing Vpgm_init1, controller 450 can generate the first program pulse in sequence 404. In one example, other parameters that controller 450 can compute include the pulse width, tp1, and the program pulse step, ΔVpgm1. Sequence 404 illustrates that after the first pulse at the initial program voltage, controller 450 can generate a program verify pulse, labeled PV in sequence 404.

It will be observed that Vpgm_init1 is different than Vpgm_init0. Additionally, tp1 is different than tp0. Additionally, ΔVpgm1 is different than ΔVpgm0. The differences are not necessarily to scale, but are exaggerated to illustrate the difference. It could be that at least one of the parameters has the same value as that computed for sequence 402. Sequence 404 is simply meant to illustrate that one or more parameters could be changed and provide the need for controller 450 to recompute the program parameters.

After the prologue, controller 450 can apply the program-verify loop, with the first program pulse can have an amplitude of Vpgm_init1 and each subsequent program pulse can have an increase of ΔVpgm1. Phase 430 illustrates the program operation for WL[1]SB[0]. Again, the number of program pulses can be one or more, and sequence 404 can have the same number or a different number of pulse and verify repetitions as the maximum.

With the application of a smart prologue, in one example, controller 450 recognizes that the next program operations will be for the same wordline (WL[1]), for N−1 additional subblocks (SB[1:N−1]). Phase 440 represents the programming of the additional subblocks. In one example, controller 450 does not compute the program parameters again for WL[1]SB[1:N−1]. Rather, controller 450 uses a reduced prologue to load the program parameters computed for SB[0] to apply to each additional SB[1:N−1] for WL[1].

Figure 5:
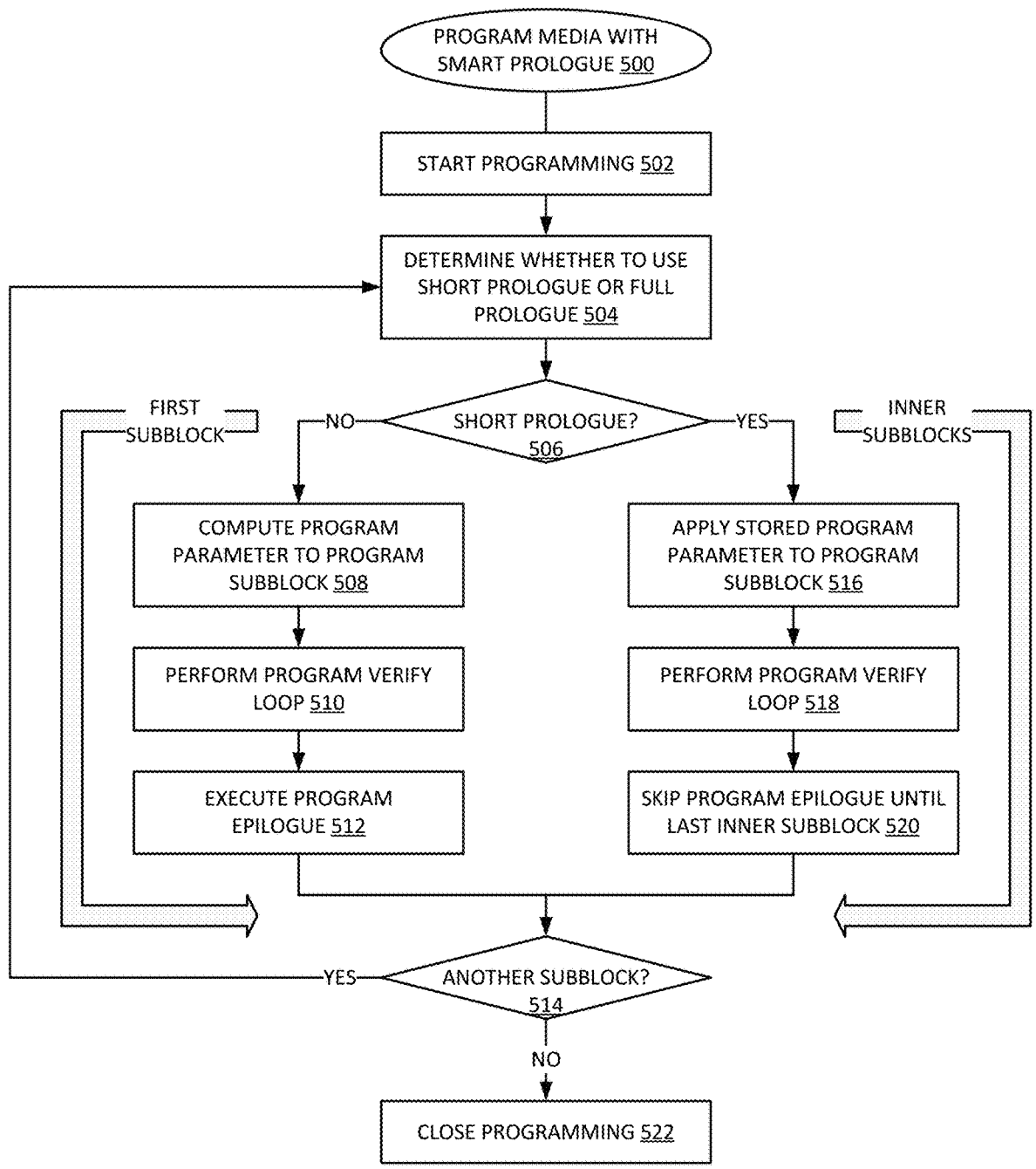
FIG. 5 is a flow diagram of an example of a process for programming with a smart prologue.

FIG. 5 is a flow diagram of an example of a process for programming with a smart prologue. Process 500 provides an example of a process to program an NV media with selective application of a shortened program prologue in accordance with any description herein.

The media controller starts the programming of the NV media, at 502. In one example, the controller determines whether to use a short prologue or a full prologue, at 504. The full prologue refers to a traditional prologue where the controller computes program parameters as is traditionally performed. The short prologue refers to a prologue where the controller uses previously-computed program parameters instead of computing new program parameters. It will be understood that the previously-computed program parameters can refer to final calculation on the program parameters for a previous program loop for a different subblock.

In one example, the controller applies the full prologue for a first subblock of a block. In one example, the controller applies the shortened prologue for the inner subblocks or the other subblocks of a block. If the controller is not to apply a short prologue, at 506 NO branch, the controller can compute a program parameter to program the subblock, at 508. The controller can then perform a program verify loop on the NV media, at 510. The controller executes a program epilogue after the programming loop completes, at 512.

If the controller is to program another subblock, at 514 YES branch, the process returns to 504 for the controller to determine whether to apply the short prologue. In one example, the controller determines if a smart prologue feature is enabled or if the short prologue is available. If smart prologue is not enabled, the controller will apply the normal prologue each time. In one example, the smart prologue is enabled through the application of a configuration command. Enabling the smart prologue capability enables the controller to selectively apply a short prologue instead of the full prologue. In one example, the host enables smart prologue via a command over a media local bus interface (MLBi).

In one example, the NVM (nonvolatile memory) device includes an NV media for cache and an NV media for primary storage, where the controller only selectively applies the short prologue when writing to the cache media. Thus, the controller can determine if the command is a command to program a portion of the cache, and if the command is for the primary storage, the controller will not apply the short prologue. In one example, the smart prologue capability is only enabled for SLC block program operations. In such an implementation, any operation other than a subsequent SLC program will reset the 'N−1' wordline address (the address of the prior program command) to 0x00 in an address storage location. Thus, the next program operation would never apply the short prologue if an address match is required to apply the short prologue. Rather, the next program operation would cause the controller to compute all program parameters.

In one example, the controller determines if the subblock is part of the same block as the subblock for which program parameters are already computed. For example, the controller can compute the program parameters and then store them as a matter of normal operation. When the controller receives another program command, the controller can determine if there is an address match, or perform some other test to determine if the command is to program a subblock having similar performance parameters for a program. Thus, the controller can apply the stored parameters when an address match occurs, and otherwise, compute new program parameters.

An address match can refer to a match of block address. An address match can refer to a match of block and wordline address (e.g., the controller can use short prologue if and only if the block and wordline address of program 'N' matches the respective addresses of program 'N–1'. It will be understood that the controller can have a register or SRAM or other storage to store address information for the determination. Depending on whether the controller will use stored parameters or compute the program parameters will determine whether the controller can use the short prologue.

In one example, the controller performs all of the above determinations to determine if the short prologue should be applied. In one example, the controller performs one or more of the above determinations to determine if the short prologue should be applied. If the short prologue is to be applied, at 506 YES branch, in one example, the controller applies a stored program parameter to program the subblock, at 512. The application of the normal prologue will occur for each time the program parameters need to be computed, such as for the first subblock in a block. The short prologue can be selectively applied for the other subblocks of the block, identified in process 500 as "inner subblocks." Reference to inner subblocks can refer to the programming of the other subblocks of the block in a loop, iteratively applying the same program parameters instead of computing new program parameters for each subblock.

Thus, the controller can apply a store program parameter to program the subsequent subblocks, at 516. The controller performs a program verify loop, at 518. The program verify loop for the short prologue can be identical to the program verify loop for the normal prologue.

With the normal prologue procedure, the controller executes a program epilogue after each subblock, as described above. In one example, the controller skips the epilogue for the inner subblocks, until the last inner subblock, at 520. Regarding skipping the epilogue, it will be understood that while process 500 illustrates a "linear" view of the process, certain operations can be performed in parallel. For example, the controller can perform the prologue for a write command while the program-verify loop is being performed for a prior write command.

Thus, for example, the controller can identify the next or subsequent write command to be for a first subblock or an inner subblock. If the controller determines for a current write command that the subblock can be treated as an inner subblock and apply a program parameter computed for a previous command/subblock. The controller can apply a reduced prologue for the current command, and then during the program-verify of the current command, determine if a subsequent write command is for another inner subblock, or if an "inner subblock" determination fails. Thus, the subsequent command can be treated as though the subblock is a first subblock of a new sequence of commands. If the subsequent command is determined to be for another inner subblock, the controller can skip the epilogue. If the subsequent command is determined to be for a "first subblock," the controller can perform the epilogue after completion of the program verify loop.

After the programming for the inner subblock, the controller can determine if there is another subblock to program, at 514. If there is not another subblock to program, 514 NO branch, the controller can close the programming, at 522.

Figure 6:
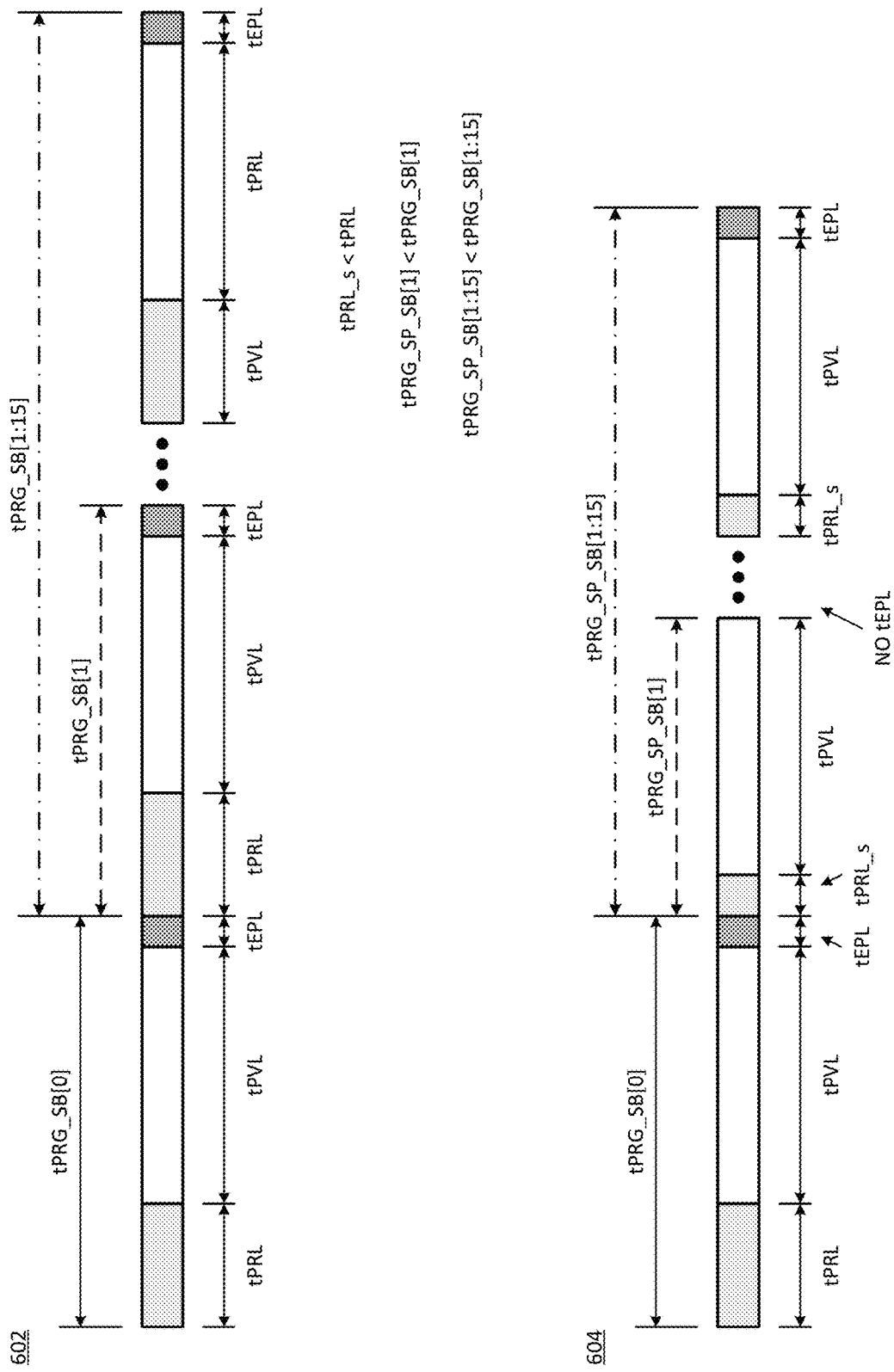
FIG. 6 is a diagram of an example of a program operation that applies a smart prologue.

FIG. 6 is a diagram of an example of a program operation that applies a smart prologue. Diagram 602 represents a program sequence where a standard prologue is applied for each subblock, where the controller performs parameter computations for every subblock. Diagram 604 represents a program sequence where a short prologue is applied for each subblock, where the controller applies a stored parameter computation for subsequent subblocks after computing it for the first subblock of a group of subblocks. The application of the short prologue can be in accordance with process 500.

The diagrams assume there are 16 subblocks per block. Other implementations can have more or fewer than 16 subblocks per block. Additionally, the diagrams assume sequential writes to all 16 subblocks. In the case that fewer than all of the subblocks are written sequentially, there can be a number of subblocks to which smart prologue is applied, and a number of subblocks in the block to which it is not applied because the subblocks are not written sequentially with the first blocks. Additionally, in such a scenario, there is no requirement that the "first" subblock written to the block for which the parameters are computed does not necessarily have to be the first subblock of the block (i.e., subblock with address 0). Reference to Subblock[0] or SB[0] can refer to the subblock with address zero, or simply the subblock first written in a sequence of subblocks (typically the subblock with the lowest address of the subblocks being written).

Diagram 602 illustrates the program operation for SB[0], having a time of tPRG_SB[0], which includes tPRL (the prologue time), tPVL (the time for the program-verify loop), and tEPL (the epilogue time). Other designators could be used. The times are shown with relative length, but are not necessarily to scale. It will also be understood that even to the extent that the lengths are to scale with respect to one implementation for one system, the same operations could have differing relative lengths in another implementation.

It will be observed that to program SB[1] in diagram 602, the controller will again perform all parameter computations, and thus, the prologue time is again tPRL for SB[1]. tPRG_SB[1] includes tPRL, tPVL, and tEPL, and is expected to be the same or approximately equal to tPRG_SB [0]. The time for programming the other subblocks will be the same. The entire time to program the entire block can be tPRG_SB[0]+tPRG_SB[1:15], which is expected to be approximately equal to 16*tPRG_SB[0].

Diagram 604 illustrates the program operation for SB[0], having a time of tPRG_SB[0], which includes tPRL (the prologue time), tPVL (the time for the program-verify loop), and tEPL (the epilogue time). It will be observed that the time for the first subblock program operation will be the same for diagram 602 and for diagram 604.

In diagram 604, the media controller can apply a shortened prologue as part of the smart prologue capability. The controller calculates the parameters to program SB[0] and will then apply the same calculations for SB[1:15]. Thus, to program SB[1] in diagram 604, the controller can skip at least some parameter computations, and thus, the prologue time can be tPRL_s, referring to a shortened prologue time. In one example, the shortened prologue can be up to approximately ⅔ or ¾ less than the normal prologue time. The time to program SB[1] in diagram 604 is designated as tPRG_SP_SB[1], referring to a time to program SB[1] with a smart prologue ("SP"). tPRG_SP_SB[1] includes tPRL_s and tPVL. In one example, tPRG_SP_SB[1] does not include the epilogue time. In one example, the epilogue is only needed after the last subblock has been programmed. Thus, the program operation of SB[15] can include the epilogue, which may be the only epilogue for the programming of SB[1:15].

In another example, the epilogue can be included in the shortened program operation and only the prologue is different. It will be understood that removing the epilogue can further shorten the prologue by keeping charge pumps and other circuitry enabled and ready. Without discharging the circuitry, there will be a reduction in prologue time that would otherwise be needed to charge up the circuitry. By performing the epilogue each time, the shortened prologue will still be shorter relative to a normal prologue but could be further shortened as described above.

The time for programming the other subblocks will be the same or comparable to SB[1]. The entire time to program the entire block can be tPRG_SB[0]+tPRG_SP_SB[1:15], which will be substantially less than 16*tPRG_SB[0]. Thus, as illustrated between the program sequences, tPRL_s<tPRL, tPRG_SP_SB[1]<tPRG_SB[1], and tPRG_SP_SB[1:15]<tPRG_SB[1:15].

Figure 7:
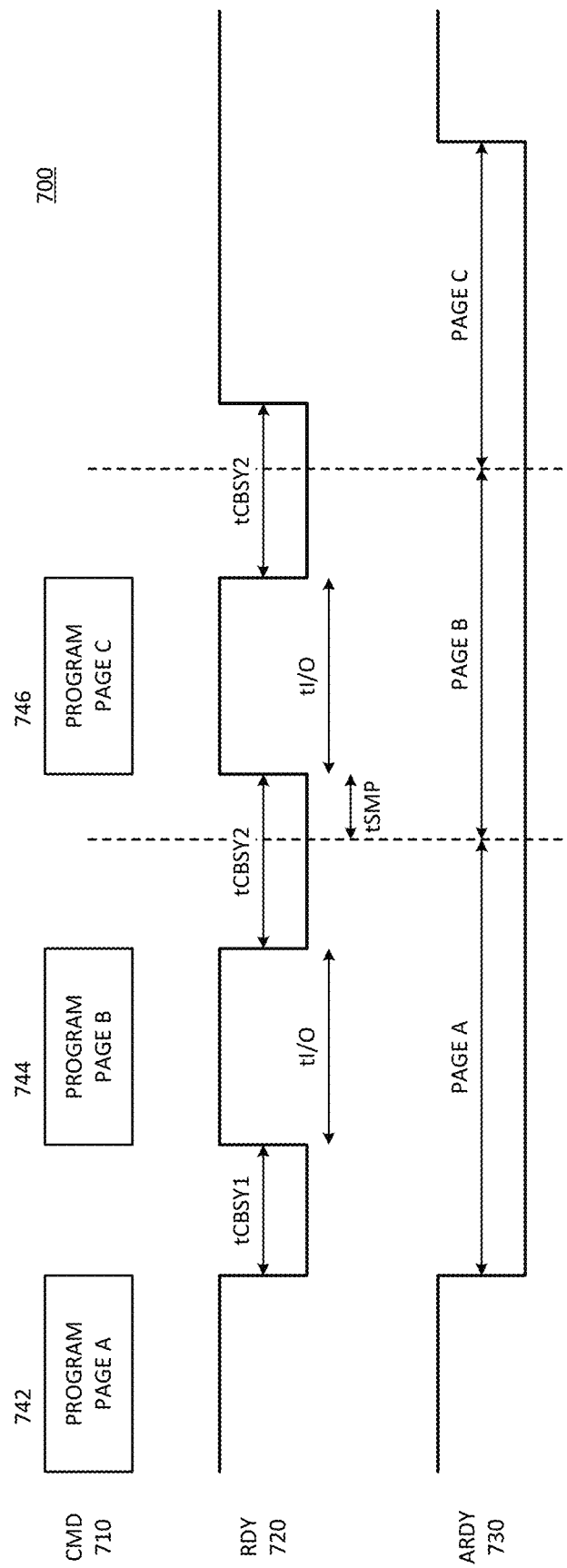
FIG. 7 is a diagram of an example of relative timing for a program operation that applies a smart prologue.

FIG. 7 is a diagram of an example of relative timing for a program operation that applies a smart prologue. Diagram 700 represents a program operation in accordance with the application of a smart prologue, such as with system 100. In one example, the system includes a cache, and diagram 700 illustrates an application of a "cache program" feature. The cache program feature enables the system to reduce the I/O latency by caching the 'N+1' page data during the 'N' page program operation, where N refers to a page of data for a current operation, and N+1 refers to a page of data for the operation after the current operation.

The application of a smart prologue feature can be added to the application of a cache program feature. The addition of smart prologue can reduce the program time by reducing the prologue, in addition to reducing the I/O latency with the cache program. The cache program feature can improve I/O latency by hiding the next page I/O latency behind the current page program operation. The smart prologue improves program time by reducing the length of the program operation.

Command signal (CMD 710) illustrates three commands received by the system. Command 742 is a program command for Page A. Command 744 is a program command for Page B. Command 746 is a program command for Page C.

The ready signal (RDY 720) represents a ready signal for the NVM device, when it is ready to receive a subsequent command from the host. The array ready signal (ARDY 730) represents a ready signal for the NV media. In response to command 742 on CMD 710, RDY 720 shows a tCBSY1, which represents a cache busy time, which represents a time to latch in the command, or the time between receipt of the command and the time for the cache to release. The tCBSY1 time represents a prologue time where the media controller prepares the media for a program operation. RDY 720 illustrates tI/O, which represents a time to input the data, which will be programmed to the media. ARDY 730 illustrates the committing of Page A data to the media. In one example, CMD 710 illustrates the receipt of command 744 during the program-verify operation time (tI/O) to receive Page A.

In response to command 744 to program Page B, RDY 720 illustrates a tCBSY2 time, which includes the time to process the command and a prologue time to prepare to write Page B. tCBSY2 includes tSMP, which represents a smart prologue time. When the smart prologue reuses the program parameters stored for Page A, tSMP can be approximately ⅓ or ¼ what tSMP would be for a case where the controller would need to calculate all program parameters. ARDY 730 illustrates the committing of Page B data to the media. It will be observed that the overall time to commit Page B is less than the time for Page A, at least in part because of the time reduction by the smart prologue. In one example, CMD 710 illustrates the receipt of command 746 during the program-verify operation time (tI/O) to receive Page B.

In response to command 746 to program Page C, RDY 720 illustrates a tCBSY2 time, which can be the same as the time for Page B, with the reduced prologue time. ARDY 730 illustrates the committing of Page C data to the media. It will be observed that the overall time to commit Page C is comparable to that of Page B, and is also less than the time for Page A, at least in part because of the time reduction by the smart prologue.

Figure 8A:
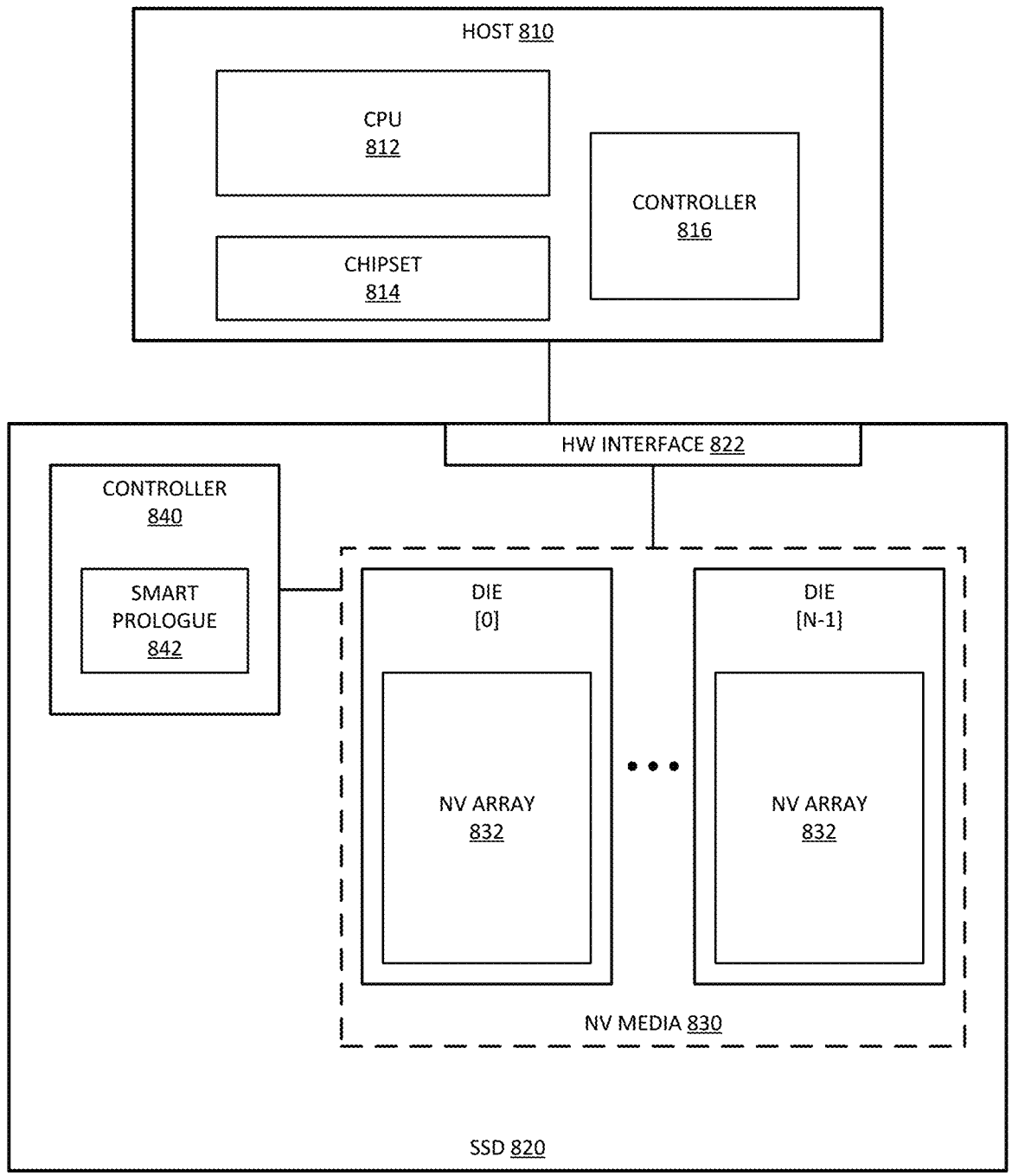
FIG. 8A is a block diagram of an example of a system with a hardware view of a solid state drive (SSD) that applies selective program parameter computation to program a nonvolatile array.

FIG. 8A is a block diagram of an example of a system with a hardware view of a solid state drive (SSD) that applies selective program parameter computation to program a nonvolatile array. System 802 represents components of a nonvolatile storage system that could implement a program with a smart prologue in accordance with any example described, such as system 100.

System 802 includes SSD 820 coupled with host 810. Host 810 represents a host hardware platform that connects to SSD 820. Host 810 includes CPU (central processing unit) 812 or other processor as a host processor or host processor device. CPU 812 represents any host processor that generates requests to access data stored on SSD 820, either to read the data or to write data to the storage. Such a processor can include a single or multicore processor, a primary processor for a computing device, a graphics processor, a peripheral processor, or a supplemental or auxiliary processor, or a combination. CPU 812 can execute a host OS and other applications to cause the operation of system 802.

Host 810 includes chipset 814, which represents hardware components that can be included in connecting between CPU 812 and SSD 820. For example, chipset 814 can include interconnect circuits and logic to enable access to SSD 820. Thus, host 810 can include a hardware platform drive interconnect to couple SSD 820 to host 810. Host 810 includes hardware to interconnect to the SSD. Likewise, SSD 820 includes corresponding hardware to interconnect to host 810.

Host 810 includes controller 816, which represents a storage controller or memory controller on the host side to control access to SSD 820. In one example, controller 816 is included in chipset 814. In one example, controller 816 is included in CPU 812. Controller 816 can be referred to as an NV memory controller to enable host 810 to schedule and organize commands to SSD 820 to read and write data.

SSD 820 represents a solid-state drive or other storage system or module that includes nonvolatile (NV) media 830 to store data. SSD 820 includes HW (hardware) interface 822, which represents hardware components to interface with host 810. For example, HW interface 822 can interface with one or more buses to implement a high speed interface standard such as NVMe (nonvolatile memory express) or PCIe (peripheral component interconnect express).

In one example, SSD 820 includes NV (nonvolatile) media 830 as the primary storage for SSD 820. In one example, NV media 830 is or includes a block addressable memory technology, such as NAND (not AND) or NOR (not OR). In one example, NV media 830 can include a nonvolatile, byte addressable media that stores data based on a resistive state of the memory cell, or a phase of the memory cell. For example, NV media 830 can be or include a three dimensional crosspoint (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

In one example, NV media 830 is implemented as multiple dies, illustrated as N dies, Die[0:{N−1}]. N can be any number of devices, and is often a binary number. SSD 820 includes controller 840 to control access to NV media 830. Controller 840 represents hardware and control logic within SSD 820 to execute control over the media. Controller 840 is internal to the nonvolatile storage device or module, and is separate from controller 816 of host 810.

The NV dies of NV media 830 include NV array 832, which can include stacks of planar arrays, a three-dimensional (3D) array, or a traditional two-dimensional array. In one example, NV media 830 includes a multiplane storage, such as double plane, triple plane, or quad plane array. In one example, NV media 830 includes a single-plane array. In one example, NV media 830 includes different media types, such as an SLC portion and an MLC portion. NV array 832 is divided into blocks and subblocks.

In one example, controller 840 includes smart prologue 842, which represents a smart prologue capability in accordance with any example described. While not specifically illustrated, controller 840 can include storage to store a computed program parameter for use by later subblocks. With smart prologue 842, controller 840 can compute a program parameter to program a first subblock of a block and store the program parameter in the storage device. Controller 840 can then apply the program parameter from the storage device to program the other subblocks of the block without needing to recompute the program parameter for the other subblocks.

Figure 8B:
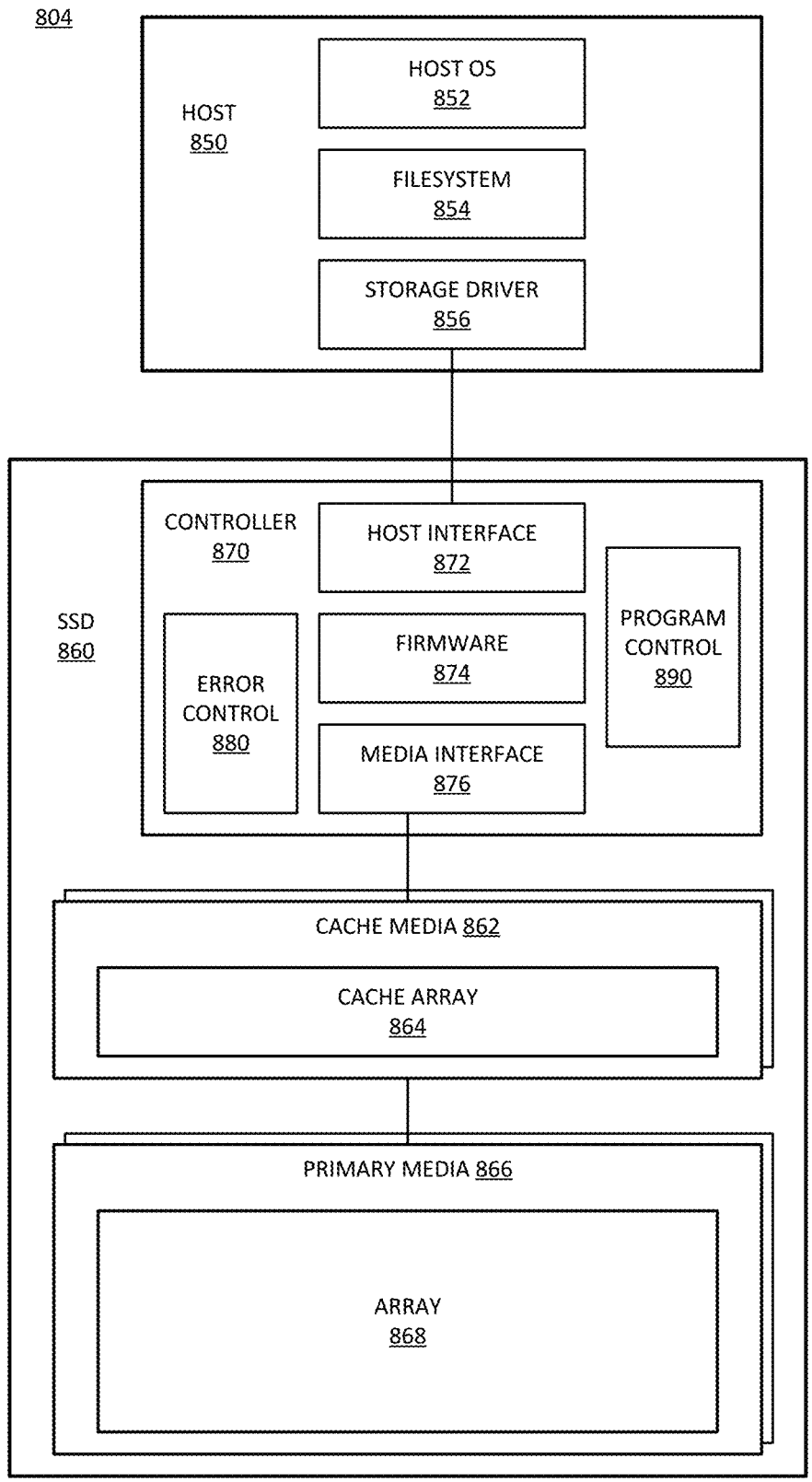
FIG. 8B is a block diagram of an example of a logical view of system with a solid state drive (SSD) that applies selective program parameter computation to program a nonvolatile array.

FIG. 8B is a block diagram of an example of a logical view of system with a solid state drive (SSD) that applies selective program parameter computation to program a nonvolatile array. System 804 provides one example of a system in accordance with system 802 of FIG. 8A. System 804 illustrates the logical layers of the host and SSD of a hardware platform in accordance with system 802. System 804 can represent software and firmware components of an example of system 802, as well as physical components. In one example, host 850 provides one example of host 810. In one example, SSD 860 provides one example of SSD 820.

In one example, host 850 includes host OS 852, which represents a host operating system or software platform for the host. Host OS 852 can include a platform on which applications, services, agents, and/or other software executes, and is executed by a processor. Filesystem 854 represents control logic for controlling access to the NV media. Filesystem 854 can manage what addresses or memory locations are used to store what data. There are numerous filesystems known, and filesystem 854 can implement known filesystems or other proprietary systems. In one example, filesystem 854 is part of host OS 852.

Storage driver 856 represents one or more system-level modules that control the hardware of host 850. In one example, drivers 856 include a software application to control the interface to SSD 860, and thus control the hardware of SSD 860. Storage driver 856 can provide a communication interface between the host and the SSD.

Controller 870 of SSD 860 includes firmware 874, which represents control software/firmware for the controller. In one example, controller 870 includes host interface 872, which represents an interface to host 850. In one example, controller 870 includes media interface 876, which represents an interface to the storage media. In one example, the storage media of SSD 860 is divided as cache media 862 and primary media 866.

Media interface 876 represent control that is executed on hardware of controller 870. It will be understood that controller 870 includes hardware to interface with host 850, which can be considered to be controlled by host interface software/firmware 874. Likewise, it will be understood that controller 870 includes hardware to interface with the media. In one example, code for host interface 872 can be part of firmware 874. In one example, code for media interface 876 can be part of firmware 874.

In one example, controller 870 includes error control 880 to handle data errors in accessed data, and corner cases in terms of compliance with signaling and communication interfacing. Error control 880 can include implementations in hardware or firmware, or a combination of hardware and software.

Cache media 862 includes cache array 864 and primary media 866 includes array 868. The various arrays can be any type of nonvolatile storage array. In one example, cache array 864 is an SLC media and array 868 is an MLC media. In one example, controller 870 includes program control 890 with smart prologue capability. In one example, program control 890 only applies smart prologue on cache media 862. In one example, program control 890 could apply smart prologue on the primary array and the cache array. Program control 890 can apply smart prologue in accordance with any example described, to selectively apply a stored program parameter instead of needing to compute every program parameter for every subblock write.

Figure 9:
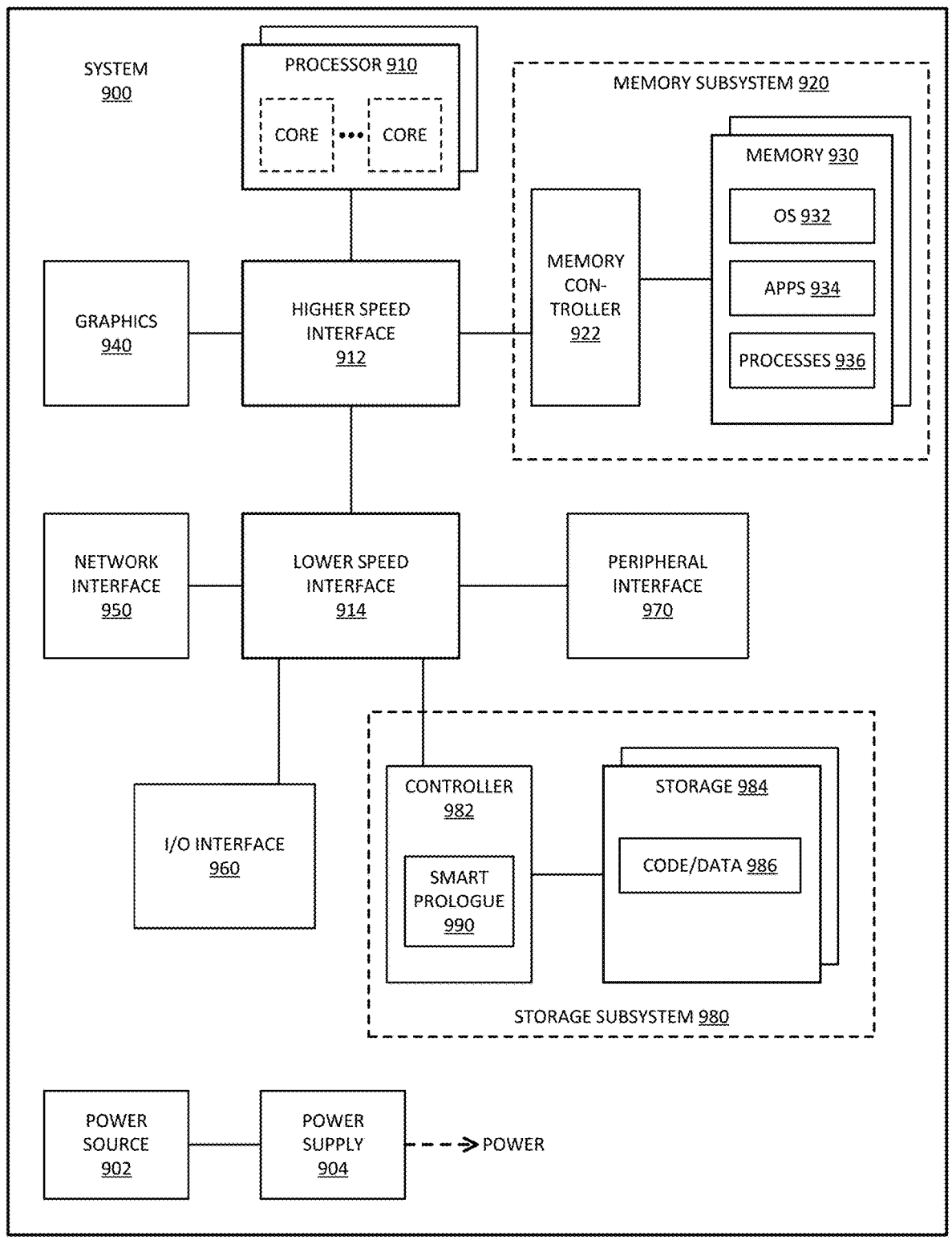
FIG. 9 is a block diagram of an example of a computing system in which selective program parameter computation to program a nonvolatile array can be implemented.

FIG. 9 is a block diagram of an example of a computing system in which selective program parameter computation to program a nonvolatile array can be implemented. System 900 represents a computing device in accordance with any example herein, and can be a laptop computer, a desktop computer, a tablet computer, a server, a gaming or entertainment control system, embedded computing device, or other electronic device. System 900 is one example of a system that can incorporate a system compatible with system 100.

In one example, system 900 includes storage subsystem 980 with controller 982 which can be enabled with smart prologue 990. Smart prologue 990 represents smart prologue capability in accordance with any example described. With smart prologue 990, controller 982 can selectively program nonvolatile media of storage 984 with a shortened prologue for subblocks that can be programmed using stored program parameters. Controller 982 can compute the program parameters for a first subblock of a sequence of writes, and then apply the previously-computed program parameters for other subblocks of the same block.

System 900 includes processor 910 can include any type of microprocessor, central processing unit (CPU), graphics processing unit (GPU), processing core, or other processing hardware, or a combination, to provide processing or execution of instructions for system 900. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices. In one example, processor 910 includes multiple cores.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
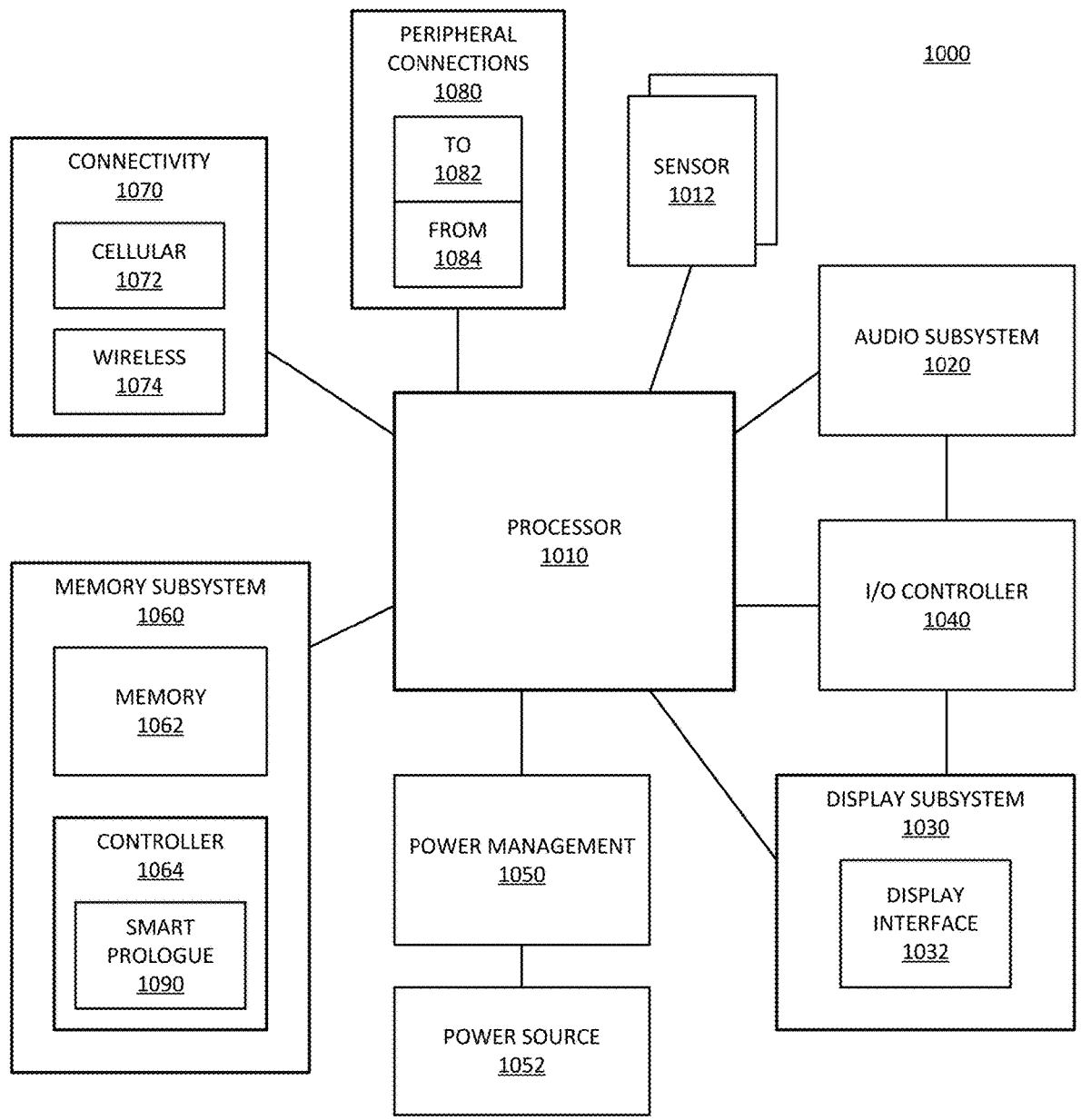
FIG. 10 is a block diagram of an example of a mobile device in which selective program parameter computation to program a nonvolatile array can be implemented.

FIG. 10 is a block diagram of an example of a mobile device in which selective program parameter computation to program a nonvolatile array can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 is one example of a system that can incorporate a system compatible with system 100.

In one example, system 1000 includes memory subsystem 1060 with controller 1064 which can be enabled with smart prologue 1090. Smart prologue 1090 represents smart prologue capability in accordance with any example described. With smart prologue 1090, controller 1064 can selectively program nonvolatile media of memory 1062 with a shortened prologue for subblocks that can be programmed using stored program parameters. Controller 1064 can compute the program parameters for a first subblock of a sequence of writes, and then apply the previously-computed program parameters for other subblocks of the same block.

System 1000 includes processor 1010, which performs the primary processing operations of system 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, an apparatus includes: a nonvolatile (NV) storage media to be written by an operation to program a cell and then verify the cell program, the NV storage media including a block of storage with multiple subblocks; and a controller to compute a program parameter to program a first subblock of the multiple subblocks and apply the program parameter to program the other subblocks of the multiple subblocks without re-computation of the program parameter for the other subblocks.

In general with respect to the descriptions herein, in one example, an apparatus includes: a nonvolatile (NV) storage media, the NV storage media including a block of storage with multiple subblocks; and a controller to compute a program parameter to program a first subblock of the multiple subblocks and apply the program parameter to program the other subblocks of the multiple subblocks without re-computation of the program parameter for the other subblocks.

In one example, the NV storage media comprises NAND (not AND) media. In one example, the NV storage media comprises single level cell (SLC) storage media. In one example, the NV storage media comprises a cache media to cache data for a primary storage media. In one example, the program parameter comprises a program start voltage. In one example, the program parameter comprises a program loop voltage step size. In one example, the program parameter comprises a maximum number of program loops. In one example, the controller is to apply the program parameter to program the other subblocks of the multiple subblocks only for subblocks within a same wordline. In one example, the apparatus further includes: a storage device to store the program parameter for application to the other subblocks. In one example, the storage device comprises a register. In one example, the storage device comprises a synchronous random access memory (SRAM) device.

In general with respect to the descriptions herein, in one example, a system includes: a processor; a solid state drive (SSD) coupled to the processor, the SSD including a nonvolatile (NV) storage media to be written by an operation to program a cell and then verify the cell program, the NV storage media including a block of storage with multiple subblocks; a storage device to store a computed program parameter; and a controller to compute a program parameter to program a first subblock of the multiple subblocks, store the program parameter in the storage device, and apply the program parameter from the storage device to program the other subblocks of the multiple subblocks without re-computation of the program parameter for the other subblocks.

In one example, the NV storage media comprises single level cell (SLC) NAND (not AND) media. In one example, the program parameter comprises a program start voltage, a program loop voltage step size, or a maximum number of program loops. In one example, the controller is to apply the program parameter to program the other subblocks of the multiple subblocks only for subblocks within a same wordline. In one example, the storage device comprises a register or a synchronous random access memory (SRAM) device. In one example, the processor comprises a multicore processor. In one example, the system further includes one or more of: a display communicatively coupled to the processor; a network interface communicatively coupled to the processor; or a battery to power the system.

In general with respect to the descriptions herein, in one example, a method for programming a nonvolatile storage media includes: computing a program parameter to program a first subblock of multiple subblocks of a NAND (not AND) storage media; storing the program parameter; and applying the program parameter to program the other subblocks of the multiple subblocks without re-computing the program parameter for the other subblocks.

In one example, applying the program parameter comprises applying a program start voltage, a program loop voltage step size, or a maximum number of program loops. In one example, applying the program parameter to program the other subblocks of the multiple subblocks comprises applying the program parameter only for subblocks within a same wordline. In one example, storing the program parameter comprises storing the program parameter in a register or a synchronous random access memory (SRAM) device.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a nonvolatile (NV) storage media to be written by an operation to program a cell and then verify the cell program, the NV storage media including a block of storage with multiple subblocks, the cell being a single level cell (SLC); and
   a controller to compute a program parameter to program a first subblock of the multiple subblocks for a program prologue, apply the program parameter to program the first subblock, perform a program epilogue for the first subblock, apply the program parameter to program the other subblocks of the block without re-computation of the program parameter for the other subblocks, and skip program epilogue for the other subblocks until a last of the other subblocks.

2. The apparatus of claim 1, wherein the NV storage media comprises NAND (not AND) media.

3. The apparatus of claim 1, wherein the NV storage media comprises a cache media to cache data for a primary storage media.

4. The apparatus of claim 1, wherein the program parameter comprises a program start voltage.

5. The apparatus of claim 1, wherein the program parameter comprises a program loop voltage step size.

6. The apparatus of claim 1, wherein the program parameter comprises a maximum number of program loops.

7. The apparatus of claim 1, wherein the controller is to apply the program parameter to program the other subblocks of the multiple subblocks only for subblocks within a same wordline.

8. The apparatus of claim 1, further comprising:
   a storage device to store the program parameter for application to the other subblocks.

9. The apparatus of claim 8, wherein the storage device comprises a register.

10. The apparatus of claim 8, wherein the storage device comprises a synchronous random access memory (SRAM) device.

11. A method for programming a nonvolatile storage media, comprising:
    computing a program parameter for a program prologue to program a first subblock of multiple subblocks of a block of NAND (not AND) storage media, the block having single level cells (SLCs);
    storing the program parameter;
    applying the program parameter to program the first subblock;
    performing a program epilogue for the first subblock;
    applying the program parameter to program the other subblocks of the block without re-computing the program parameter for the other subblocks; and
    skipping program epilogue for the other subblocks until a last of the other subblocks.

12. The method of claim 11, wherein applying the program parameter comprises applying a program start voltage, a program loop voltage step size, or a maximum number of program loops.

13. The method of claim 11, wherein applying the program parameter to program the other subblocks of the multiple subblocks comprises applying the program parameter only for subblocks within a same wordline.

14. The method of claim 11, wherein storing the program parameter comprises storing the program parameter in a register or a synchronous random access memory (SRAM) device.

* * * * *